Oct. 1, 1957 J. M. DE BELL, JR 2,808,573

ELECTRICAL FILTER

Filed Sept. 18, 1952

INVENTOR.
JOHN M. DE BELL, JR

BY

Darby & Darby

ATTORNEYS

United States Patent Office 2,808,573

Patented Oct. 1, 1957

2,808,573

ELECTRICAL FILTER

John M. De Bell, Jr., Passaic, N. J., assignor to Allen B. Du Mont Laboratories, Inc., Clifton, N. J., a corporation of Delaware Application September 18, 1952, Serial No. 310,291

2 Claims. (Cl. 333—73)

This invention relates to electrical wave filters and particularly to filters operating in the higher frequency bands and utilizing distributed parameters, such as wave-guides and tuned cavities.

In television systems, there is frequently a need to have electrical filters characterized by flat, usually wide, pass bands with sharp or controlled cutoff characteristics. Such filters are found in television transmitters where they are employed to remove part of the lower side band energy of a television signal as required to conform with legal requirements of the Federal Communications Commission. One such filter circuit which is exceptionally economical of elements and yet which achieves the desired band pass characteristics is known as a lattice filter. This filter configuration, which is actually seldom used in low frequency filters because of the narrow tolerances within which the filter components must be fixed, is known to be equivalent in many respects to a waveguide arrangement known as the magic T. The magic T may take on any one of a number of configurations as shown in chapter 8 of Microwave Duplexers—volume 14 of the Radiation Laboratory series, by Smullin and Montgomery.

One of the problems in devising a filter for operation in the higher frequency bands stems from the difficulty of connecting elements together without introducing undesired reactances and impedances. For instance, in a filter to remove the lower side band of a television signal having a carrier frequency in the ultra-high frequency band around 700 mc., it is necessary to provide means for reducing the amplitude of the output signal at a very high rate with respect to frequency since even a 6 mc. television signal is a small percentage of the 700 mc. carrier. This is equivalent to saying that the cutoff slope of the filter must be exceedingly steep. By utilizing magic T arrangements it is possible to couple tuned cavities of sufficiently high Q to achieve the desired steep cutoff characteristics and yet not have these cavities react upon each other since the coupling between them may be more readily controlled. Furthermore, in a symmetrical combination of magic T arrangements, such as will be disclosed hereinafter, it is possible to eliminate the reflected signal which otherwise would be returned by an asymmetrical combination to the transmitter and improperly affect its operation.

It is one object of this invention to provide an improved high frequency electrical filter using distributed components.

Other objects are to provide a symmetrical filter in which no interference is obtained from the reflected wave and to provide a filter in which a preferential coupling is maintained between high Q tuned elements.

Still further objects will in part be obvious and in part appear hereinafter following the description in the specification together with the drawings in which.

Figure 1:
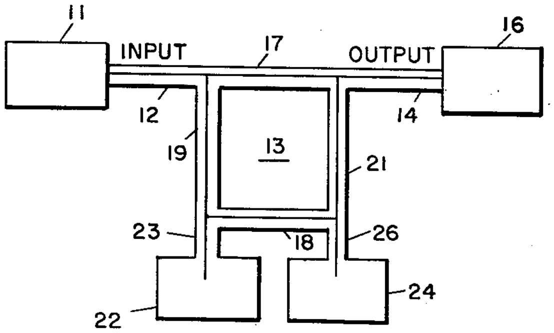
Fig. 1 shows one arrangement of elements connected as a filter according to the invention.

In the circuit in Fig. 1, a signal source 11 is connected by means of a transmission line 12 to an input terminal of a hybrid ring 13. As is described in the text referred to above, the hybrid ring is one form of the magic T. The output terminal of the hybrid ring 13 is in turn connected by a transmission line 14 to a device 16 which may be an antenna, another filter or other circuit.

The ring 13 itself is composed of four arms of which arms 17 and 18 have the characteristic impedance $Z_0$, which is the same as the impedance of lines 12 and 14, while arms 19 and 21 have the characteristic impedance $$\frac{Z_0}{\sqrt{2}}$$

A tuned cavity 22 is connected to the junction of arms 18 and 19 by means of a transmission line 23 while a similar cavity 24 is connected by means of a line 26 to the junction of arms 18 and 21.

Figure 2:
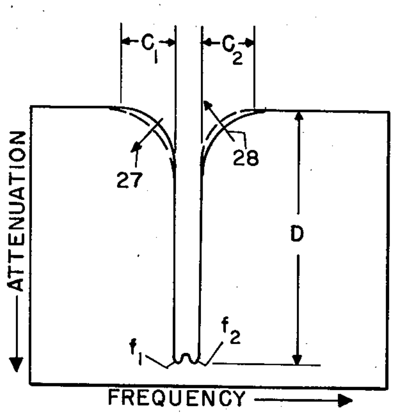
Fig. 2 shows the frequency response of the circuit in Fig. 1.

In the operation of the circuit in Fig. 1, the cavities 22 and 24 are tuned to the frequencies $f_1$ and $f_2$ as shown in the response curve of Fig. 2. The attenuation suffered by the signal from source 11 in passing from the input terminal of ring 13 to the output terminal is indicated by the curve in Fig. 2. The slope of the cutoff characteristics of the circuit of Fig. 1 are indicated by the width of the frequency bands $C_1$ and $C_2$ which are measured from the top of the curve at the condition of low attenuation to full attenuation at the bottom of the curve. It has been found that an optimum condition exists when the lines 23 and 26 have an electrical length equivalent to about ⅜ λ, where λ stands for the wavelength of the carrier frequency, and that, for lengths greater than the optimum $C_2$ decreases, while for lengths less than the optimum $C_1$ decreases. These changes are indicated by the arrows 27 and 28 and show that the cutoff characteristics of either the upper side band or the lower side band of the filter may be improved at the expense of the cutoff characteristics of the other side band, merely by varying the length of lines 23 and 26. As is well known, the widths $C_1$ and $C_2$ are also affected by the Q value of cavities 22 and 24 and these factors in turn are affected by the tightness of coupling of the cavities to the remainder of the circuit. The cavities are coupled by extending the center conductors of the lines 23 and 26 into the cavities 22 and 24 respectively to act as small antennas and the tightness of coupling is proportional to the length which the central conductors extend into the cavities. Alternatively, other known types of coupling to the cavities 22 and 24, such as loop coupling, may be employed instead of antenna, or probe, coupling.

Figure 3:
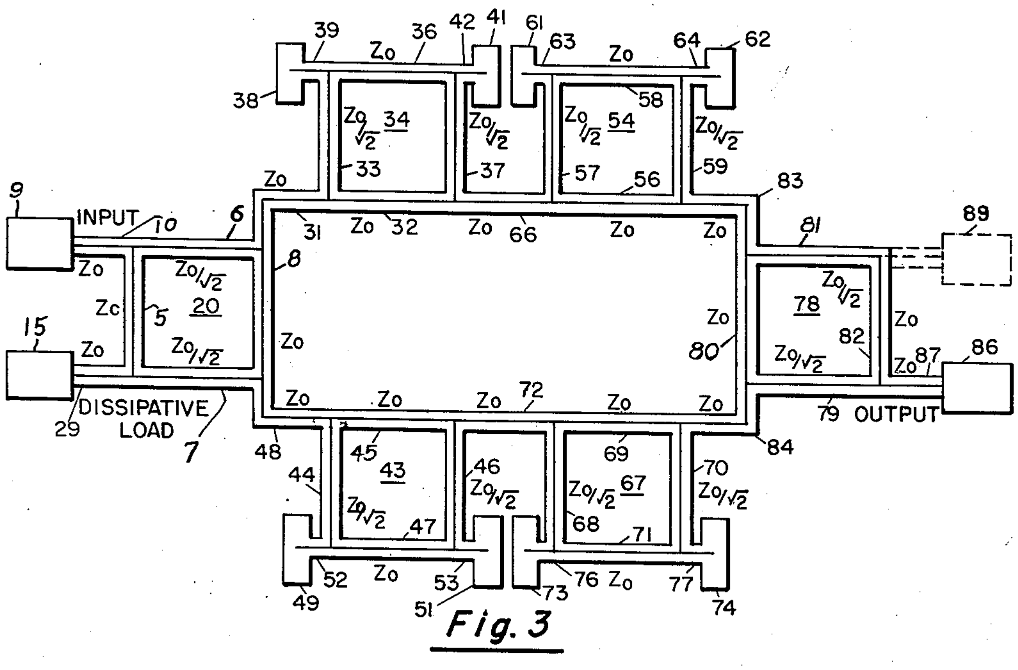
Fig. 3 shows a complete symmetrical filter arrangement according to the invention.

Fig. 3 shows a symmetrical filter circuit incorporating the simple circuit of Fig. 1. Six magic T hybrid rings are used in the circuit of Fig. 3 in order to achieve the bandwidth required to filter out the lower side-band of a television signal operating in the 700 mc. region. For other uses, it might not be necessary to employ more than four of these hybrid rings.

The first hybrid ring 20 comprises arms 5—8. The relative impedances of arms 5—8, as well as the remainder of the circuit, are indicated on the drawing and the lengths of all arms in all of the hybrid rings are approximately ¾λ, although other impedances and other sizes may be substituted as shown in the text referred to above. A source 9 of signals is connected by means of a transmission line 10 to the junction of arms 5 and 6 while a circuit 15, usually a dissipative load, is connected by means of a transmission line 29 to the junction of arms 5 and 7. The junctions of arm 8 with arms 6 and 7 are symmetrically connected to the remainder of the filter circuit for purposes which will be described more completely hereinafter.

The junction of arms 6 and 8 is connected by means of a transmission line 31 to the junction of arms 32 and 33 of a second hybrid ring magic T network 34. Ring 34 is completed by arms 36 and 37.

A first cavity resonator 38 is connected to the junction of arms 33 and 36 by a transmission line 39 while a second cavity resonator 41 is connected by means of a transmission line 42 to the junction of lines 36 and 37. Lines 39 and 42 correspond to lines 12 and 16 in Fig. 1, and, as described in connection therewith, are preferably constructed with a length of ⅜λ.

The circuit symmetrical to ring 34 is ring 43 comprising arms 44—47 and connected to ring 20 by a transmission line 48 which is preferably of the same length as transmission line 31; although the length of these two lines is otherwise arbitrary. Cavity resonators 49 and 51 are connected to the ring 43 by transmission lines 52 and 53 respectively and are preferably of the same length as lines 39 and 42 respectively.

Ring 34 may be connected to another ring network 54 if it is found desirable to employ the additional filtering made possible thereby. Ring 54 comprises the four arms 56—59. Cavities 61 and 62 are connected to the ring 54 by transmission lines 63 and 64, respectively, which follow the same general rule of being approximately ⅜λ long, and ring 54 is connected to the ring 34 by means of transmission line 66.

Symmetrically arranged with respect to ring 54 is a ring 67, comprising arms 68—71, which is connected to the ring 43 by means of a transmission line 72. In order to maintain the desired symmetry line 72 is preferably of the same electrical length as line 66. Resonant cavities 73 and 74 are connected to the ring 67 by means of transmission lines 76 and 77, respectively, which, as before, are preferably symmetrical with lines 63 and 64.

An output ring 78 comprising arms 79—82 serves as an output coupling network for the filter. If rings 54 and 67 are omitted, ring 78 is connected directly to rings 34 and 43; otherwise the ring 78 is connected by means of symmetrical transmission lines 83 and 84 to the rings 54 and 67 respectively. A utilization device 86, similar to the utilization device 16 in Fig. 1, is connected by means of a transmission line 87 to the junction of lines 79 and 82 of network 78.

As is described in the text referred to above, magic T networks, whatever the form, are characterized by pairs of terminals which are isolated from each other in the sense that an electrical signal connected to one of these pairs of terminals produces no output signal at the other end of these terminals. This condition is true of each of the rings in Fig. 3. For instance, under normal conditions where the impedances are preferably matched, the application of a signal from source 9 to the ring 20 produces no direct output signal to the dissipative load 15. Instead load 15 receives its signal from the wave reflected by the cavity resonators connected to the rings 34 and 43 (as well as by resonators connected to rings 54 and 67 if they are used).

As shown in Fig. 2, the cavity resonators of a given hybrid ring are tuned to different frequencies within the band of operation, thereby producing a narrow frequency band within which the attenuation is very high. It is the frequencies within this band which are reflected into the dissipative load 15. Therefore, when an entire double sideband television signal produced by source 9 is applied to the complete network of Fig. 3, that part of the signal lying between $f_1$ and $f_2$ as shown in Fig. 2 is absorbed by the dissipative load. The cavity resonators of rings 34 and 43, if properly and symmetrically adjusted, can be made to resonate so that this band between $f_1$ and $f_2$ covers part of the lower sideband of the entire television signal and this part of the lower sideband will therefore be eliminated from the signal as transmitted to the utilization device 86. In this way the legally required vestigial sideband signal is produced.

Figure 4:
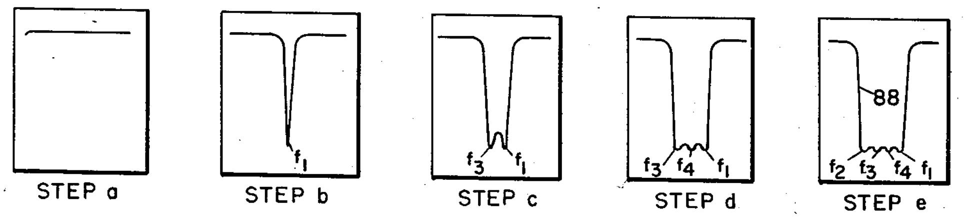
Fig. 4 shows successive steps of tuning the circuit in Fig. 3.

The reason for the additional rings 54 and 67 may be shown by referring to Fig. 4 which depicts the steps of tuning the entire filter network. In step *a* none of the cavity resonators of Fig. 3 have been adjusted and the entire band of frequencies from the source 9 passes to the utilization device 86. Step *b* indicates the narrow band reflected to the load 15 when the most selective of all of the cavities in Fig. 3 is tuned to its proper resonant point $f_1$. Since a symmetrical condiiton is required, this means that a symmetrically arranged pair of cavity resonators must be tuned to frequency $f_1$. These two symmetrically arranged cavities might be 38 and 49 or they might be cavities 41 and 51, etc.

Following the proper tuning of this first pair of cavities, a second pair of cavities is tuned to the frequency $f_3$. As before, the tuning must be symmetrical, and, if it be assumed that resonators 38 and 49 are to be tuned to frequency $f_1$, then it may be that resonators 41 and 51 will be tuned to frequency $f_3$. This second pair of resonators is preferably adjusted to leave a positive peak between the frequencies $f_1$ and $f_3$.

Next, another pair of cavities is tuned to a frequency $f_4$ between frequencies $f_1$ and $f_3$ and adjusted to smooth the response, and finally the fourth pair of cavities is tuned to the frequency $f_2$.

Step *e* shows a symmetrical response of the overall filter, but it is frequently desirable to obtain an asymmetrical response. This may be done by increasing the lengths of transmission lines connected to the proper cavities as described in connection with lines 23 and 26 of Fig. 1. For instance, if cavities 62 and 74 are tuned to resonate at frequency $f_2$, the lines 64 and 77 may be positioned to be greater than the optimum length of ⅜λ, thereby slanting the portion 88 of the curve in step 5 to the left.

A second source 89 is shown in dotted lines in Fig. 3. In the usual television terminology, source 89 may be the sound transmitter of a television station while source 9 may be the video transmitter. Source 89, if it is connected to the remainder of the circuit, simply supplies an additional signal to the utilization device 86. Due to the symmetry of the circuit, the signal from source 89 does not flow into the source 9, nor does the signal from source 9 flow into the source 89. The complete filter thus serves as a mixer, or duplexer, for the two signals.

While this invention has been described in terms of specific embodiments, it will be understood that other modifications may be made, all of which fall within the scope of the following claims.

What is claimed is:

1. A symmetrical electrical circuit comprising first, second, third, and fourth magic T networks each having first, second, third, and fourth terminals, the first and second terminals of each of said networks being substantially electrically isolated from each other for electrical signals within a predetermined band of frequencies, a first source of electrical signals within said band connected to the first terminal of said first network; a utilization circuit connected to the first terminal of said second network; a second source of electrical signals within said band connected to the second terminal of said second network; a load circuit connected to the second terminal of said first network; a first pair of connections of equal length linking the third and fourth terminals of said first network to the third terminals of said third and fourth networks, respectively; a second pair of connections of equal length connecting the third and fourth terminals of said second network to the fourth terminal of said third and fourth networks, respectively; a first pair of filters tuned to substantially the same first frequency within said band and connected to the first terminal of said third and fourth networks, respectively, by connections which are approximately ⅜ of the wavelength of said first frequency; and a second pair of filters tuned to substantially the same second frequency in said band and connected to the second terminals of said third and fourth networks, respectively, by connections which are approximately ⅜ of the wavelength of said second frequency.

2. The circuit of claim 1 in which the ⅜ wavelength connections connecting said first pair of filters to the first terminals of said third and fourth networks are equally and correspondingly variable in electrical length to adjust the cutoff characteristics of said electrical circuit.

References Cited in the file of this patent

UNITED STATES PATENTS

| | | |
|---|---|---|
| 2,416,790 | Barrow | Mar. 4, 1947 |
| 2,498,548 | Howard | Feb. 21, 1950 |
| 2,531,419 | Fox | Nov. 28, 1950 |
| 2,532,539 | Counter | Dec. 5, 1950 |
| 2,593,120 | Dicke | Apr. 15, 1952 |
| 2,632,808 | Lawson | Mar. 24, 1953 |